United States Patent [19]

Feuerbaum et al.

[11] 4,241,259
[45] Dec. 23, 1980

[54] SCANNING ELECTRON MICROSCOPE

[75] Inventors: Hans P. Feuerbaum; Johann Otto, both of Munich, Fed. Rep. of Germany

[73] Assignee: Siemens Aktiengesellschaft, Munich, Fed. Rep. of Germany

[21] Appl. No.: 30,378

[22] Filed: Apr. 16, 1979

[30] Foreign Application Priority Data

May 2, 1978 [DE] Fed. Rep. of Germany ....... 2819165

[51] Int. Cl.³ .............................................. H01J 9/38
[52] U.S. Cl. .................................... 250/457; 250/311; 250/492 B
[58] Field of Search ............ 250/311, 457, 451, 492 B

[56] References Cited

U.S. PATENT DOCUMENTS

| | | | |
|---|---|---|---|
| 2,356,963 | 8/1944 | Young | 250/457 |
| 2,472,316 | 6/1949 | Rennie | 250/457 |
| 3,766,427 | 10/1973 | Coates et al. | 250/311 |
| 3,784,815 | 1/1974 | Coates | 250/311 |
| 3,790,155 | 2/1974 | Longamore | 250/311 |

*Primary Examiner*—Harold A. Dixon
*Attorney, Agent, or Firm*—Kenyon & Kenyon

[57] ABSTRACT

A scanning electron microscope with an electron optical column and a sample chamber for a test sample disposed therein in a vacuum, in which the sample holder forms, directly or indirectly, an hermetic seal for the sample chamber. The electron-optical column is preferably suspended underneath the sample chamber, and the sample holder or its base form a cover for the sample chamber permitting simple and troublefree contact with the sample. Use of the electron microscope for the testing of integrated circuits is disclosed.

2 Claims, 2 Drawing Figures

SCANNING ELECTRON MICROSCOPE

BACKGROUND OF THE INVENTION

This invention relates to a scanning electron microscope in general and more particularly to a scanning electron microscope with an electron-optical column for the contactless testing of a sample, preferably an electronic component, in particular an integrated circuit disposed in a sample chamber on a sample holder, an image of which sample is then reproduced on a viewing screen in larger scale.

As is known, contactless potential measurements can be made with a scanning electron microscope for the functional testing of electronic components, in particular integrated circuits. The scanning electron microscope consists essentially of an electron-optical column which contains an electron gun and is generally provided with equipment for gating the electron beam and for deflecting the electron beam. These devices are disposed within the electron column in a vacuum. The component to be tested is in a sample chamber which is also evacuated.

At the measuring point the primary electron beam releases secondary electrons from a conductor of the module which are collected by an electron collector and converted into electrical signals. The number of secondary electrons released by the primary electron beam at the measuring point depends on the potential at the measuring point. At positive potential, only relatively few secondary electrons are released from the conductor surface, and a correspondingly dim picture spot appears on a viewing screen. Zero potential and negative potential result in a greater number of secondary electrons with a correspondingly bright picture spot. Therefore, conductors of positive potential appear dark on the viewing screen, and conductors of negative potential result in bright portions of the reproduced picture.

Accordingly, the characteristics of the conductor potential can be determined by this potential contrast measurement and displayed on the viewing screen by scanning the conductors of the unit under test.

For quantitative potential measurements, the scanning electron microscope is provided with a spectrometer, such as a retarding field spectrometer. A cylindrical deflection capacitor leads the secondary electrons through a retarding field to the electron collector which is followed by a control amplifier whose output signal controls the spectrometer via a feedback path. The grid voltage at the retarding field electrode is readjusted until the voltage between grid and measuring point has regained its original, constant value. Then the grid voltage change corresponds directly to the potential change at the measuring point of the test sample.

For functional testing or defect analysis and for displaying the potential distribution through this potential measurement, integrated circuits, for example, including their ceramic casing are placed into the sample or specimen chamber. The electrical leads are combined in special cables and brought through the sample chamber wall by means of vacuum leadthroughs. However, long control lines are sensitive to interference, in particular when transmitting high-frequency control signals, and may lead to a flattening-out of the rising and falling edges and to the overshooting and undershooting of the signals as well as to cross-talk. The moving device required to position the sample relative to the primary electron beam is likewise in a vacuum and, therefore, must be driven externally by vacuumtight leadthroughs (Scanning Electron Microscopy/IITRI, Chicago (USA), April 1976 (Part IV), pages 615 to 624).

The scanning electron microscope is shut off and the sample chamber opened in order to exchange specimens. The air entering also flows into the electronic optical column, wherefore the danger of contaminating its sensitive components cannot be precluded. After replacing the test sample, both the sample chamber and the electron-optical column must be evacuated again.

SUMMARY OF THE INVENTION

Now, it is an object of the present invention to improve a scanning electron microscope of the kind described at the outset, in particular to design the sample chamber so as to substantially reduce the effects of the wiring arrangements mentioned and make it possible to change test samples in a simple manner.

According to the present invention, this problem is solved in that the sample holder forms a hermetic seal in the housing of the sample chamber. It is disposed, as a sealing component of the chamber wall, on the optical axis of the primary electron beam. The electrical leads of the test sample are then located outside the vacuum so that interfering leads are obviated. An integrated circuit can be tested directly on its test fixture, for instance, on a computer-controlled test stand.

In one special embodiment of the scanning electron microscope of the present invention there is provided, between the electron-optical column and the sample chamber, a closure such as a mechanical slide, by means of which the electron-optical column can be sealed vacuumtight. This closure makes the exchange of test samples in the sample chamber possible with the vacuum in the column remaining intact. The slide may be provided with a primary electron beam aperture through which the beam can pass during operation.

Since it is necessary for the functional testing of electronic components, in particular integrated circuits, to provide a great number of electrical connections to connect the component to electrical connectors for supply, control and test voltages, it may be expedient to dispose the electron-optical column below the sample chamber. In this embodiment, the sample holder then forms, directly or indirectly, the vacuumtight cover for the sample chamber. For potential contrast measurements this cover may be detachably joined to the housing of the sample chamber such as by screws.

In another embodiment the sample holder may be mounted so as to be movable in its lengthwise direction, i.e. transverse to the direction of the primary electron beam, for instance, by designing the contact surfaces between the sample holder and the cover as sliding surfaces. A sample arbitrarily movable in the plane transverse to the direction of the primary electron beam is obtained by mounting a thrust ball bearing between the sample chamber housing and the sample holder.

It may be expedient, under some circumstances, not to have the sample holder serve directly as the vacuumtight closure, but to dispose it on an additional plate. When an integrated circuit is the sample, a reinforcement of the integrated circuit board may establish the vacuumtight, yet movably mounted connection to the sample chamber housing. When testing integrated circuits, such boards serve the accommodation of the line terminating elements such as terminating resistors and smoothing capacitors. The electrical conductors are then connected, via vacuumtight lead-throughs of the sample holder, to the respective electrical connectors of the sample.

DETAILED DESCRIPTION OF THE INVENTION

Figure 1:
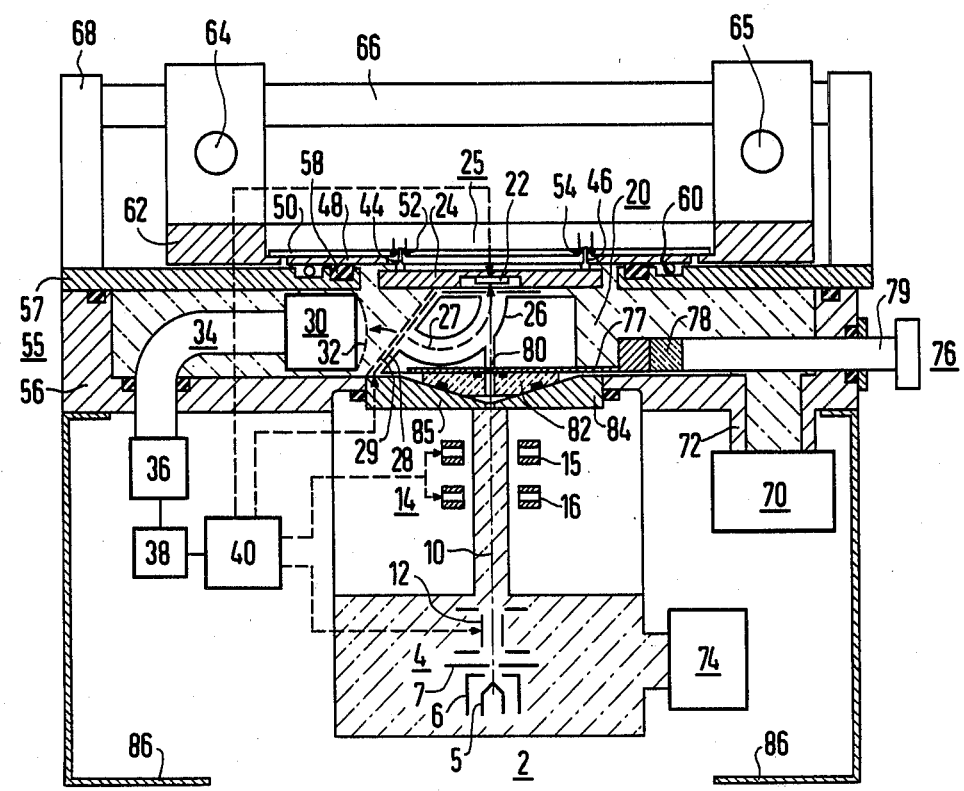
FIG. 1 is a schematic illustration of an embodiment of a scanning electron microscope according to the present invention.

According to FIG. 1, the electron-optical column 2 of a scanning electron microscope contains an electron gun 4 which consists essentially of a cathode 5, a control electrode 6, and an anode 7. The electron gun 4 produces a primary electron beam 10, indicated in the Figure by a dash-dotted line and capable of being transformed into a pulse sequence by means of a gating device 12. Also provided is a deflection device 14 with coils 15 and 16, by means of which the electron beam 10 can be deflected and thus positioned on an electronic module 22 under test. Module 22 is disposed in a vacuum in a specimen chamber 20 and may be an integrated circuit, for example. The test unit, i.e., module 22, is fastened to a test unit holder 24.

The secondary electrons released from the test unit 22 are fed, by means of a cylindrical deflection capacitor 26, to an electron collector 30 across the retarding field of two retarding field electrodes 28 and 29 of a retarding field spectrometer. Generally, the electron collector 30 contains, between a collector net 32 and a scintillator, not shown, an acceleration section for the secondary electrons whose path 27 is indicated in the Figure by a dashed line. The photos released at the scintillator are fed via a light guide to a photomultiplier 36 which is generally coupled to a sensitive preamplifier. The photomultiplier 36 is followed by a control amplifier 38 which can control, for instance via a feedback loop not shown in the figure, the retarding field of the retarding field electrodes 28 and 29.

For simplification there is provided in the Figure a common electronic system 40 which controls both the gating device 12 and the deflection device 14 for both the primary electron beam 10 and the retarding field spectrometer. In addition, the electronic system 40 is also to assume the function of power supply for the sample 22 and furnish, for example, test pulses for the sample 22, as indicated in the Figure by dashed functional lines.

In conjunction with an integrated circuit as the test sample 22, the latter is mounted on a sample holder 24 which forms part of a vacuumtight closure 25 for the sample chamber 20, said closure 25 consisting of a circuit board 50 for the integrated circuit and a reinforcement 48. The sample holder 24 is fastened by means of plugs, only two of which are shown in the Figure and marked 44 and 46. The plug sockets 52 and 54, respectively, serve as vacuumtight lead-throughs and may be soldered to the circuit board 50, for instance. This circuit board 50 serves to accommodate the line terminating elements for the electrical leads to the sample 22. The electrical leads are brought to the sample 22 via the vacuumtight lead-throughs 52 and 54 and via lead-through in the sample holder 24 not detailed in the Figure. The vacuum seal between the closure 25 and the housing 55 of the sample chamber 20 is made by a vacuum gasket 58. The housing 55 of the sample chamber 20 may consist, for example, of a receptacle 56 and a cover 57. All components led through the housing 55 are provided with vacuum seals, partly not detailed. A thrust bearing 60, enabling the sample holder 24 and with it, the sample 22 to be shifted in the plane perpendicular to the primary electron beam 10, is provided between the housing 56 and the reinforcement 48.

In a simpler embodiment of the sample chamber 20, such as is required for potential contrast measurements in the sample 22, for instance, there may be provided, instead of the mounting mode shown with a thrust ball bearing 60, a slide bearing formed by appropriately machining the contact surfaces between the reinforcement 48 and the housing 56 of the sample chamber. Alternatively, the sample 22 may even be mounted immovably in the housing 56 of the sample chamber 20.

In such an embodiment of the scanning electron microscope the sample holder may also be joined in a vacuumtight manner directly to the housing 55 of the sample chamber.

The desired areas of the sample 22 can be positioned in the plane perpendicular to the primary electron beam 10 by moving the sample holder 24 relative to the electron beam generating system. For this purpose, the sample holder 24 is connected, via the reinforcement 48 and the circuit board 50, to a frame 62 which is connected to a pillow block 68 by means of guide rods 64 and 65 for motion in the longitudinal direction and guide rods 66 for motion in the transverse direction. Together with the guide rods and the pillow block, the frame forms a carriage which makes any desired positioning of the sample 22 relative to the primary electron beam 10 possible.

The sample chamber 20 is provided with a nipple 72 to which a vacuum pump 70 is connected. The electron-optical column 2 is likewise provided with a vacuum pump 74.

In one particularly advantageous embodiment of the scanning electron microscope a closure 76 which contains a slide 77 and may preferably be vacuum tight is provided between the electron optical column 2 and the sample chamber 20. Through an electrical insulation 78, such as of glass, it is connected to a shank 79 which is used for its actuation. The slide 77 is provided with an aperture 80 for the primary electron beam 10 and sealed by a sealing system 82, such as of ceramic, comprising vacuum seals, abutting against pole pieces 84 and 85, on the one hand, and against the sample chamber 20 on the other hand. To change samples, the closure 76 is actuated by moving the slide 77 laterally, and the vacuum of the column 2 is separated from the sample chamber 20, whereby the danger of contaminating the internal equipment of the column 2 is correspondingly reduced and a new evacuation of the column 2 during the exchange of samples is obviated.

The sample chamber 20 rests on a table 86 which is only indicated schematically as a stand in the Figure.

Figure 2:
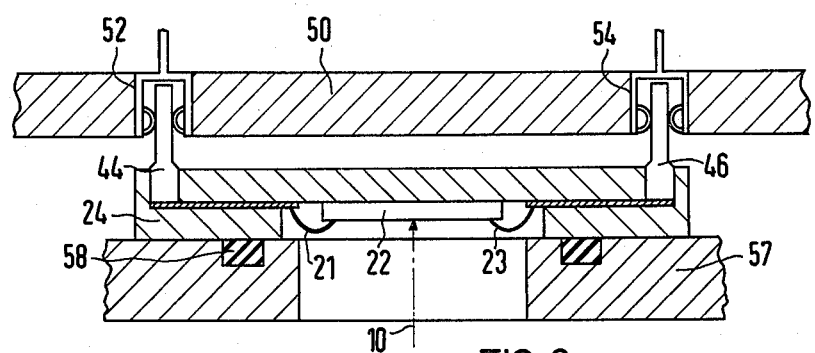
FIG. 2 depicts a special embodiment of the vacuumtight closure.

Under certain circumstances, the sample holder 24 consisting of ceramic, for example, may also form the vacuum tight closure of the sample chamber 20 directly, as shown in FIG. 2. The sample 22 is fastened to the sample holder 24, through which the electrical leads are brought vacuum tight, only two of which are shown in the Figure and marked 21 and 23. The leads 21 and 23 are thin wires, each connected to a plug 44 and 46, respectively. The respective sockets 52 and 54 of the plugs 44 and 46 are fastened in the circuit board 50. Disposed on the upper flat side of the circuit board 50 are the line terminating elements, not shown in the Figure, for measuring, testing and exchanging, and therefore they are freely accessible. The sample holder 24 is fastened, preferably movably, i.e., movable in the plane transverse to the primary electron beam 10 indicated by a dash-dotted line, to the cover 57 of the test unit chamber 20 and sealed by means of the vacuum seal 58.

In the embodiment shown, an integrated circuit was selected as unit to be tested. But, the scanning electron microscope can also be used for testing other electronic components such as transistors, in which case the substrate of the semiconductor part or the lower housing part form, directly or indirectly, the vacuum tight closure of the sample chamber.

Furthermore, the scanning electron microscope with the special embodiment of the sample chamber can be used generally for the enlarged reproduction of objects in the known operating modes and also for X-ray microanalysis, for example.

What is claimed is:

1. In a scanning electron microscope with electron-optical column for the contactless testing of a sample disposed in a sample chamber in a vacuum on a sample holder, said sample holder being one which forms, directly or indirectly, a vacuum tight closure for the sample chamber, the improvement comprising a thrust ball bearing disposed between the closure and the housing of the sample chamber.

2. The improvement according to claim 1 for the functional testing of integrated circuits, and further including a circuit board for accepting an integrated circuit disposed on a reinforcement to which the sample holder is fastened and which is movably mounted on the housing of the sample chamber and connected vacuum tight to the housing.

* * * * *